United States Patent
Fukazawa

(12) 
(10) Patent No.: US 6,423,146 B1
(45) Date of Patent: Jul. 23, 2002

(54) METHOD FOR CLEANING A SEMICONDUCTOR SUBSTRATE

(75) Inventor: Yuji Fukazawa, Yokohama (JP)

(73) Assignee: Kabushiki Kaisha Toshiba, Kanagawa (JP)

(*) Notice: Subject to any disclaimer, the term of this patent is extended or adjusted under 35 U.S.C. 154(b) by 0 days.

(21) Appl. No.: 08/907,896

(22) Filed: Aug. 11, 1997

(30) Foreign Application Priority Data

Aug. 12, 1996 (JP) .............................. 8-212511
Aug. 5, 1997 (JP) .............................. 9-210629

(51) Int. Cl.[7] .............................. B08B 3/00; B08B 3/08; B08B 3/12
(52) U.S. Cl. .............................. 134/2; 134/26; 134/29; 134/902
(58) Field of Search .............................. 134/2, 3, 25.1, 134/25.4, 26, 28, 29, 32, 33, 902, 1, 1.3

(56) References Cited

U.S. PATENT DOCUMENTS

| | | | | |
|---|---|---|---|---|
| 5,261,966 A | * | 11/1993 | Mashimo et al. | 134/2 |
| 5,415,191 A | * | 5/1995 | Mashimo et al. | 134/902 X |
| 5,464,480 A | * | 11/1995 | Matthews | 134/1.3 |
| 5,470,393 A | * | 11/1995 | Fukazawa | 134/3 |
| 5,672,212 A | * | 9/1997 | Manos | 134/1.3 |
| 5,759,971 A | * | 6/1998 | Manako | 134/3 X |

FOREIGN PATENT DOCUMENTS

SU 1424072 * 9/1988

OTHER PUBLICATIONS

Handbook of Semiconductor Wafer Cleaning Technology, Noyes Publications, pp. 28–67 and 131–151, 1993.*

* cited by examiner

Primary Examiner—Lyle A. Alexander
Assistant Examiner—Alexander Markoff
(74) Attorney, Agent, or Firm—Finnegan, Henderson, Farabow, Garrett & Dunner, L.L.P.

(57) ABSTRACT

In a method for cleaning a semiconductor substrate, ozone water is supplied to a cleaning chamber, which contains the substrate, thereby to oxidize the surface thereof, and thus form a thin oxide film on the surface. After a lapse of a predetermined time period, ammonium hydroxide is mixed with the ozone water, thereby generating a cleaning liquid. The cleaning liquid is applied to the surface of the substrate to clean the surface. At this time, the oxide film reduces the etching rate at which the surface of the substrate is etched when it is cleaned.

8 Claims, 4 Drawing Sheets

METHOD FOR CLEANING A SEMICONDUCTOR SUBSTRATE

BACKGROUND OF THE INVENTION

The present invention relates to a method for cleaning the surface of a semiconductor substrate in one of the steps of manufacturing a semiconductor device.

In general, the surface of a silicon substrate is cleaned before element layers are formed on the substrate Known as a method for cleaning substrates is the method RCA proposed in 1970. This method consists of SC-1 cleaning for removing particles and the like and SC-2 cleaning for removing metal impurities and the like.

The SC-1 cleaning is performed by using a cleaning liquid heated to 70 to 80° C. and composed of ammonium hydroxide ($NH_4OH$), hydrogen peroxide ($H_2O_2$) and pure water ($H_2O$) mixed in the ratio of 1:1:5 vol. The SC-2 cleaning is effected by using a cleaning liquid composed of hydrochloric acid (HCl), hydrogen peroxide and pure water mixed in the ratio of 1:1:1:5 vol.

The SC-1 cleaning is performed mainly for removing organic substance or dust from the surface of a silicon substrate. The above-mentioned cleaning liquid is heated to 70 to 80° C. The substrate is soaked in the liquid for about 5 to 10 minutes. Thereafter, the substrate is rinsed and dried.

The cleaning liquid etches the surface of the substrate since it contains ammonium hydroxide which is alkali. Thus, in the SC-1 cleaning, particles and the like are removed from the surface of the substrate due to lift-off effect.

It is reported that as shown in FIG. 6, the higher the ammonium hydroxide concentration in the cleaning liquid and the higher the etching rate of the surface of the substrate, the larger the amount of particles removed in the S-C 1 cleaning (M. Meuris, *Microcontamination* [1992]).

However, it is also reported that as shown in FIG. 7, the higher the ammonium hydroxide concentration, the greater the roughness (micro-roughness) of the surface of the substrate due to anisotropic etching, degrading the gate oxide film (T. Ohmi, *ECS* [1992]).

In the conventional cleaning method, hydrogen peroxide is decomposed, changing the mixing ratio of hydrogen peroxide to ammonium hydroxide. The rate of the hydrogen peroxide decomposition depends on the impurity concentration in the cleaning liquid, also. Thus, the decomposition accelerates if the cleaning liquid contains iron (Fe), copper (Cu) or the like. Therefore, it is difficult to control the mixing ratio. Furthermore, as is known in the art, iron or aluminum (Al), if any contained in the ammonium hydroxide or hydrogen peroxide, adheres to the surface of the substrate.

Therefore, the amount of particles removed in the SC-1 cleaning depends on the ammonium hydroxide concentration.

To summarize, the SC-1 cleaning has the following disadvantages:

First, the surface of the semiconductor substrate is greatly roughed (increase of micro-roughness), and the gate oxide film is degraded.

Second, the mixing ratio of hydrogen peroxide to ammonium hydroxide varies since the hydrogen peroxide is decomposed during cleaning. Furthermore, the cleaning liquid accelerates decomposition of the hydrogen peroxide if it contains iron, copper or the like. Therefore, it is difficult to control the mixing ratio of the cleaning liquid.

BRIEF SUMMARY OF THE INVENTION

The object of the present invention is to provide a method for cleaning a semiconductor substrate, in which the degree to which the surface is roughed due to etching is reduced, metal is prevented from adhering to the surface, and the mixing ratio of a cleaning liquid can be easily controlled.

The method of the present invention comprises a step of applying ozone water to the surface of a semiconductor substrate set in a cleaning chamber, and a step of generating a cleaning liquid in which an alkali liquid and ozone water are mixed at a desired ratio, after a lapse of a predetermined time period, and applying the cleaning liquid to the surface of the semiconductor substrate. By virtue of those features, an oxide film is formed on the surface of the substrate due to the ozone water, and reduces the degree to which the surface of the substrate is roughed when the substrate is cleaned by the cleaning liquid. As a result, the surface of the substrate can be kept flatter than in the conventional cleaning method.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
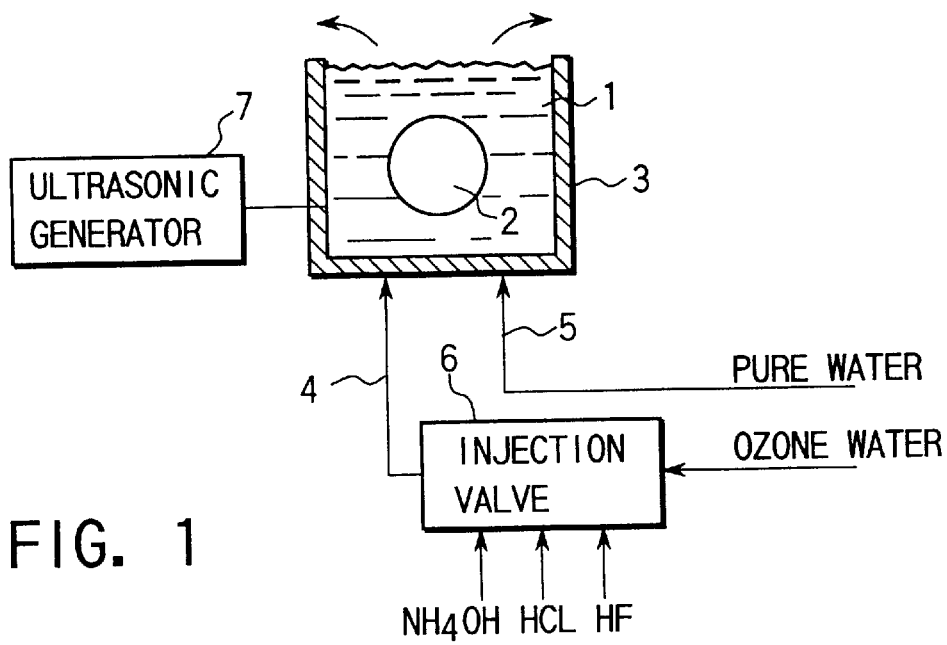
FIG. 1 shows a first system for carrying out the method of the present invention for cleaning a semiconductor substrate.

The embodiment of the present invention will be explained in detail with reference to the accompanying drawings as follows:

FIG. 1 shows a first example of the structure for carrying out the method of the present invention for cleaning a semiconductor substrate formed of, e.g. silicon.

The first example of the structure comprises: a cleaning chamber 3, filled with a cleaning liquid 1 in which an alkali liquid and ozone water are mixed, for cleaning a substrate 2 formed of, e.g., silicon which is set in the cleaning chamber 3; a cleaning liquid-supplying pipe 4, connected to the cleaning chamber 3, for supplying a cleaning liquid thereto; and a pure water-supplying pipe 5 for supplying pure water to the cleaning chamber 3.

The cleaning liquid-supplying pipe 4 is provided to supply ozone ($O_3$) water also, in addition to the cleaning liquid. Before the cleaning chamber 3, an injection valve 6 is located which can separately supply ammonium hydroxide ($NH_4OH$), hydrogen fluoride (HF) and chlorine (HCl). The cleaning liquid-supplying pipe 4 is connected to the injection valve 6, and connected therefrom to the cleaning chamber 3. The ozone water to be supplied from the cleaning liquid-supplying pipe 4 is obtained by dissolving ozone gas in pure water. The concentration of ozone in the ozone water can be increased up to approximately 20 ppm (to be more specific, it can be varied from approximately 0.1 ppm to 20 ppm). Furthermore, the concentration of ammonium hydroxide is set to fall within the range of 0.1 to 5% by weight.

In order to discharge the liquid from the cleaning chamber 3, the cleaning liquid or pure water is supplied to the cleaning chamber 3 until it overflows therefrom to the outside. In the cleaning chamber 3, a ultrasonic wave generating device 7 is provided which radiates a ultrasonic wave onto the substrate 2 in the cleaning liquid supplied to the cleaning chamber 3, thereby to more effectively clean the substrate 2. The ultrasonic wave generating device 7 generates a ultrasonic wave having a high frequency of approximately 1 MHz, and radiates the ultrasonic wave onto the substrate 2 in the cleaning liquid to vibrate the substrate 2. Such a vibration effect enhances the cleaning effect obtained by the cleaning liquid which is inserted between the substrate 2 and a foreign object, e.g., dust adhering thereto to remove the foreign object. Thus, the foreign object can be more easily removed from the substrate 2.

Next, the cleaning method of the present invention will be explained with reference to the timing chart shown in FIG. 2 as follows:

First of all, a substrate 2 formed of, e.g., silicon is set in the cleaning chamber 3, and ozone water is supplied to the cleaning chamber 3 at a rate of about 20 l/min for 5 minutes.

Then, while ozone water is being supplied to the cleaning chamber 3, the injection valve 6 is operated, thereby to mix ammonium hydroxide at a rate of about 200 ml/min with ozone water such that the volume ratio of the ozone water to the ammonium hydroxide reaches 100 to 1, and then such a mixed liquid is supplied from the injection valve 6 to the cleaning chamber 3 as a cleaning liquid. The cleaning chamber 3 becomes filled with the cleaning liquid after a lapse of two minutes from the start of supply of the cleaning liquid. Furthermore, when the cleaning liquid is supplied to the cleaning chamber 3 filled with the cleaning liquid, the surface of the substrate 2 is cleaned.

Thereafter, supply of the cleaning liquid is stopped, and pure water is supplied to the cleaning chamber 3, thereby to rinse the substrate 2. Then, the substrate 2 is dried.

As occasion demands, there is a case where hydrogen fluoride (HF) and chlorine (HCl) are mixed with ozone water, by use of the injection valve 6, instead of ammonium hydroxide ($NH_4OH$), and the SC-2 cleaning is performed. The explanation of the SC-2 cleaning is omitted.

Figure 3A:
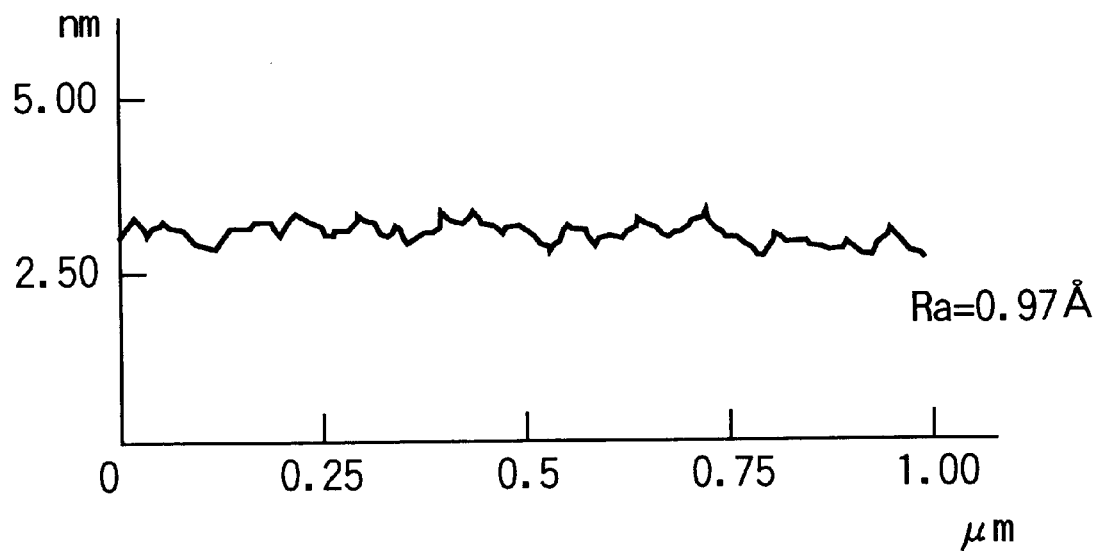
FIGS. 3A and 3B respectively illustrate the roughness of the surfaces of semiconductor substrates cleaned by the cleaning method of the present invention and a conventional cleaning method.
Figure 3B:
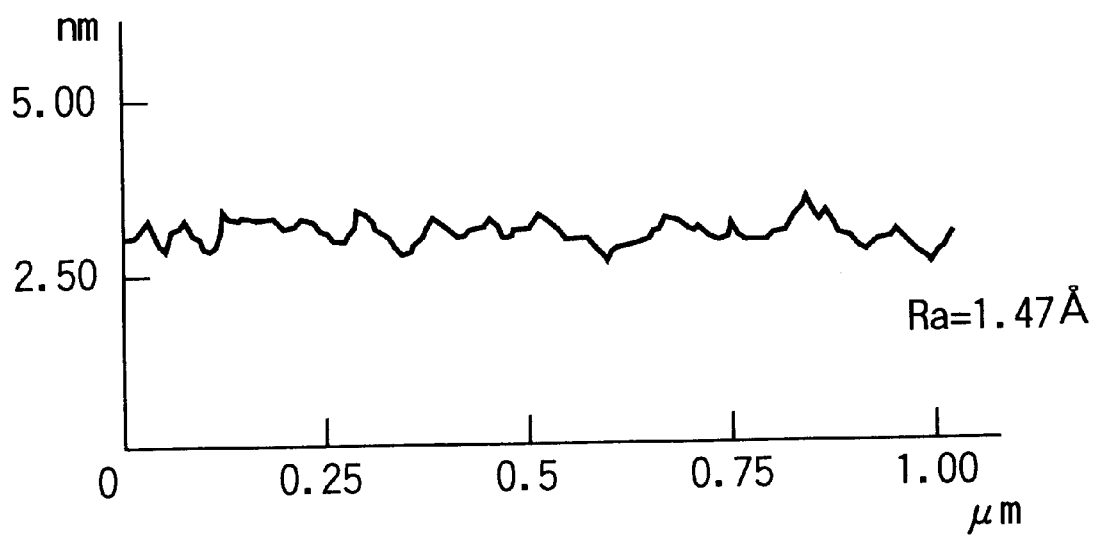

FIGS. 3A and 3B are views for illustrating the roughness of the surfaces of the substrates cleaned, which are based on AMF images.

As shown in FIG. 3A, in the cleaning method of the present invention, in the case where the substrate of the substrate is cleaned by use of an alkali cleaning liquid composed of ozone water and ammonium hydroxide or the like, the average roughness Ra of the substrate is 0.97 angstrom. On the other hand, as shown in FIG. 3B, in the case where the conventional cleaning method (SC-1 cleaning using a cleaning liquid composed of ammonium hydroxide and hydrogen peroxide) is carried out for 10 minutes, the average roughness Ra of the substrate is 1.47 angstrom.

In the embodiment of the present invention, the aforementioned time period of cleaning using the ozone water, cleaning liquid and pure water and the aforementioned amount of each of them are examples. Actually, the time period and the amount are determined in accordance with the degree to which the substrate is to be cleaned. In other words, they are not limited to the above-mentioned time period and amount.

Furthermore, in the embodiment of the present invention, the surface of the substrate can be kept flat for the following reason:

When the substrate is cleaned, a chemical oxide film is formed on the surface of the substrate due to the ozone water supplied, and then the surface of the substrate is etched by ammonium hydroxide. Thus, the silicon etching is assumed to be restricted.

To summarize, in the present invention, a chemical oxide film is formed on the substrate due to the ozone water, before the substrate is cleaned by use of a cleaning liquid in which ozone water and an alkali liquid are mixed together. Thus, the degree to which the surface of the substrate is etched during cleaning is reduced, and thus the substrate is kept flat.

Therefore, in the cleaning method of the present invention, when the surface of the substrate is cleaned, it is prevented from being roughened due to etching.

Figure 4A:
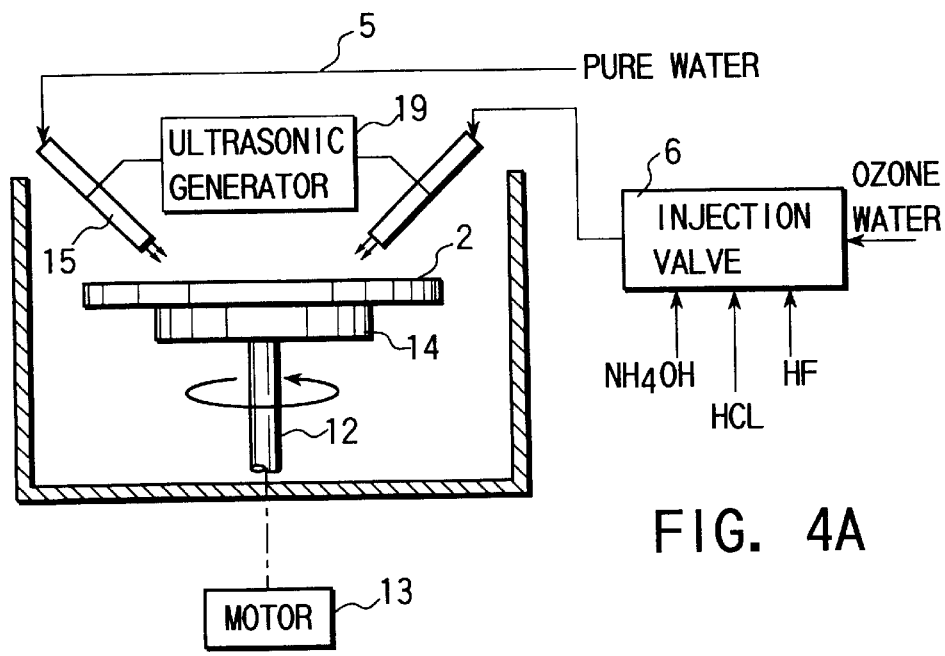
FIGS. 4A and 4B show a second example of the structure for carrying out the cleaning method of the present invention.

FIG. 4A shows a second example of the structure for carrying out the cleaning method of the present invention. In the second example, the same structural elements are denoted by the same reference numerals as in the first example, and the explanations of the structural elements are omitted.

The second example of the structure has a chamber 11 in which a rotating table 14 is provided. The rotating table 14 is connected to a motor 13 by a rotation shaft 12. A substrate 2 formed of, e.g., silicon is attracted and fixed to the rotating table 14 by vacuum chucking or the like. A nozzle 15 for applying pure water and a nozzle 16 for applying the cleaning liquid are provided above the substrate 2.

A pure water-supplying pipe 5 for supplying pure water is connected to the nozzle 15, and an injection valve 6 is connected to the nozzle 16 by a cleaning liquid-supplying pipe 4.

Figure 4B:
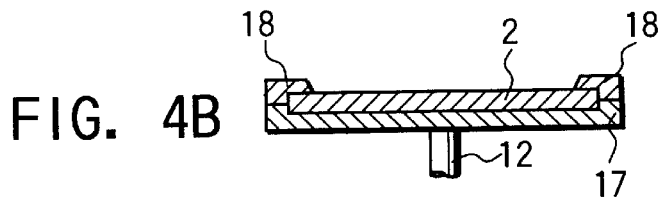

The substrate 2 may be fixed to a rotating table 17 as shown in FIG. 4B. To be more specific, a chuck 18 vertically movable may hold an end portion of the substrate 2, thereby fixing the substrate 2 to the rotating table 17.

Furthermore, a ultrasonic generator 19 is connected to the nozzles 15 and 16, and intended to radiate a ultrasonic wave to the cleaning liquid or pure water to be supplied such that the ultrasonic wave is applied to the substrate 2, enhancing the cleaning effect. The ultrasonic generator 19 is identical to the ultrasonic generator 7 of the first example.

Figure 2:
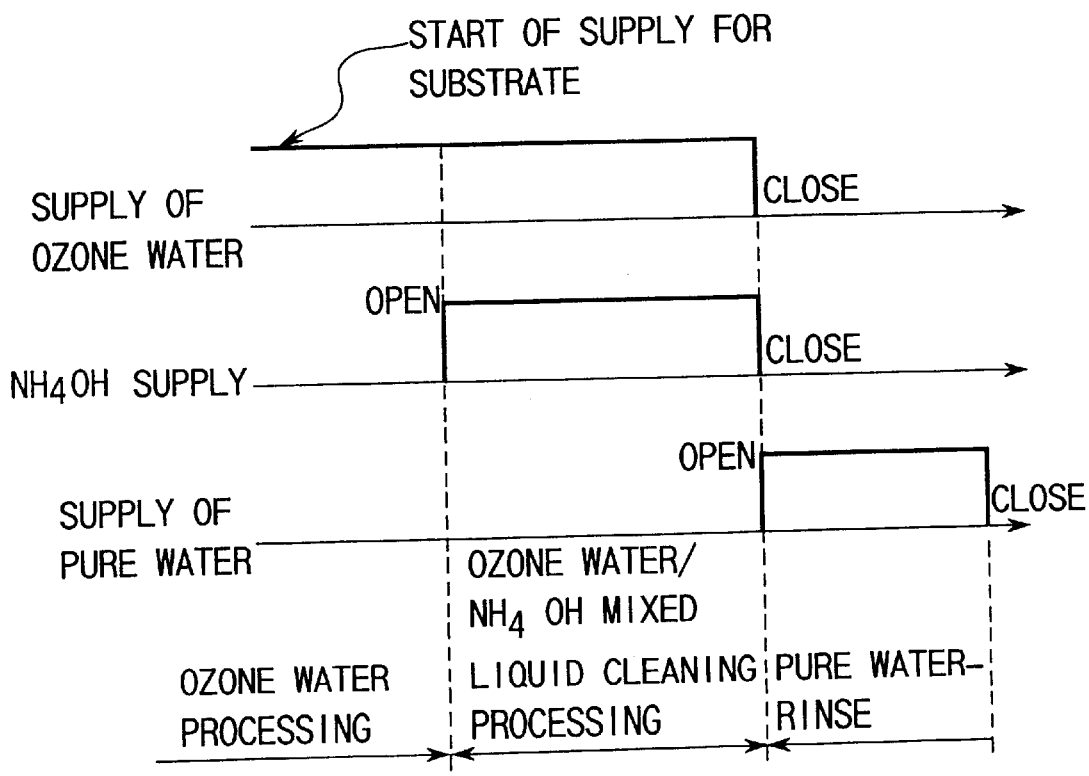
FIG. 2 is a timing chart for use in explaining the cleaning method of the present invention.

In the second example, the substrate 2 is cleaned at the same timing as in the first example, which is shown in FIG. 2.

More specifically, in the second example, when the table 14 is being rotated, with the substrate 2 fixed to the table 14, ozone water is applied from the nozzle 16 to the substrate 2 for, e.g., 5 minutes.

Next, while the ozone water is being applied, the injection valve 6 is operated, thereby to mix ammonium hydroxide with the ozone water such that the volume ratio of the ozone water to ammonium hydroxide reaches 100 to 1. Such a mixed liquid is applied to the substrate 2 as a cleaning liquid. When the cleaning liquid is applied to the substrate 2 for, e.g. three minutes, the surface of the substrate 2 is cleaned. After application of the cleaning liquid is stopped, pure water is applied to the substrate 2 to rinse the substrate 2, and then the substrate 2 is dried.

In the second example, the above-mentioned time periods for which the ozone water, cleaning liquid and pure water are applied to the substrate are examples. Actually, the time periods are determined in accordance with the amount of each of the ozone water, cleaning liquid and pure water and the degree to which the substrate is to be cleaned. In other words, they are not limited to the above-mentioned time periods.

Figure 5:
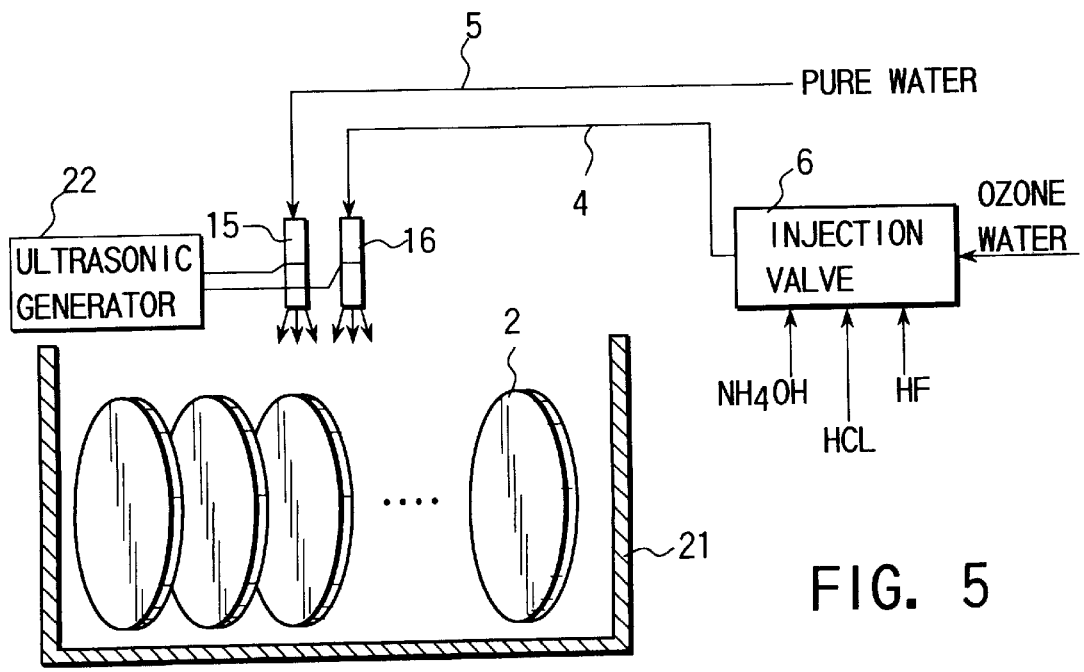
FIG. 5 shows a third example of the structure for carrying out the cleaning method of the present invention.
Figure 6:
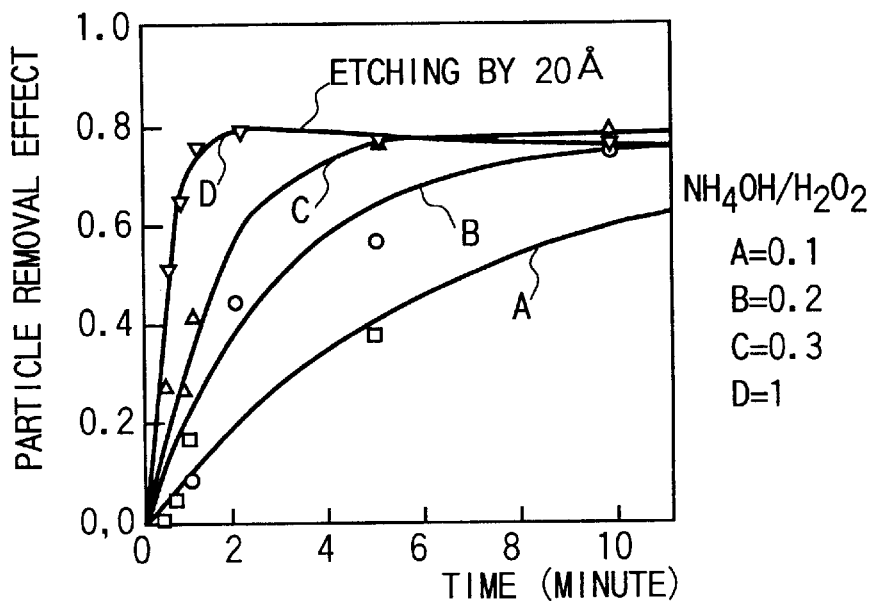
FIG. 6 illustrates the effect of removal of particles which varies due to the concentration of ammonium hydroxide in SC-1 cleaning of a conventional cleaning method.
Figure 7:
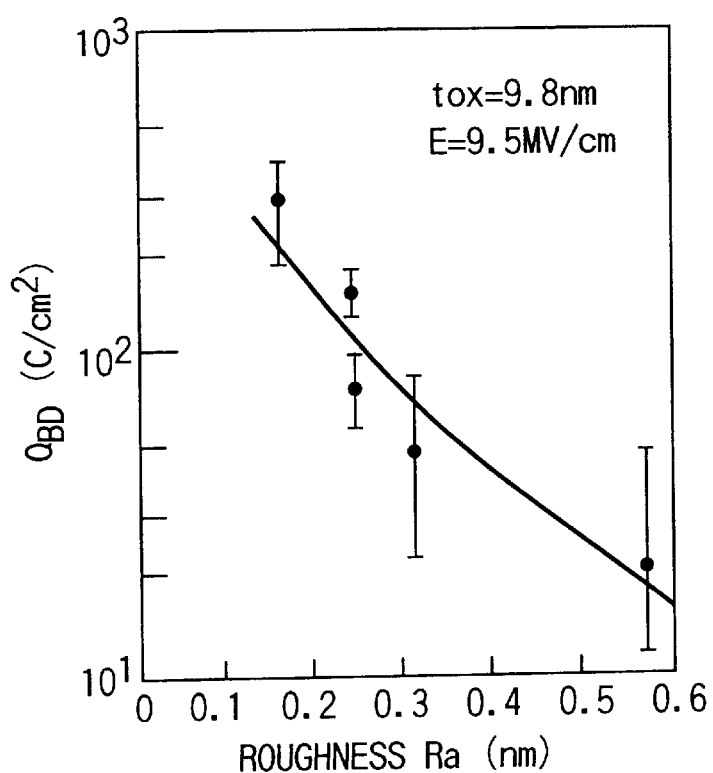
FIG. 7 is a view for use in explaining the roughness of the surface of the substrate, which depends on the concentration of ammonium hydroxide, in the SC-1 cleaning.

FIG. 5 shows a third example of the structure for carrying out the cleaning method of the present invention. In the third example, the same structural elements are denoted by the same reference numerals as in the first example, and the explanations of the structural elements are omitted.

In the third example, a plurality of substrates 2 each formed of, e.g., silicon are set in a cleaning chamber 21 such that they are arranged apart from each other. The nozzles 15 and 16 are provided above the substrates 2, and the pure water-supplying pipe 5, the cleaning water-supplying pipe 4, and the injection valve 6 are provided. Furthermore, a ultrasonic generator 22 is connected to the nozzles 15 and 16, and intended to radiate a ultrasonic wave to the cleaning liquid or pure water to be supplied such that the ultrasonic wave is applied to the substrate 2, enhancing the cleaning effect. The ultrasonic generator 22 is identical to the ultrasonic generator 7 of the first example.

In the third example, each of the substrates 2 is cleaned at the same timing as in the timing chart shown in FIG. 2.

More specifically, the substrates 2 are set in the cleaning chamber 21, and ozone water is sequentially applied to each of the substrates 2 for 5 minutes. Then, while ozone water is being applied, the injection valve 6 is operated, thereby to mix ammonium hydroxide with ozone water such that the volume ratio of the ozone water to the ammonium hydroxide reaches 100 to 1. Such a mixed liquid is applied to each substrate 2 as a cleaning liquid for about 3 minutes, thereby cleaning the surface thereof.

In the third example, each of the semiconductor substrates can be rotated. When each of the substrates is being rotated, for example, ozone water is applied to the substrate. Further, each substrate can be rotated while pure water is being applied during the rinsing step.

Thereafter, application of the cleaning liquid is stopped, and pure water is applied to each substrate 2 to rinse it. Then, each substrate 2 is dried.

In the third example also, the aforementioned time periods for which the ozone water, cleaning liquid and pure water are applied to each substrate 2 are examples. Actually, the time periods are determined in accordance with the amount of each of the ozone water, cleaning liquid and pure water, and the degree to which each substrate 2 is to be cleaned, etc. In other words, they are not limited to the aforementioned time periods.

As may be understood from above, in the second and third examples, the same advantageous effects as in the first example can be obtained, and the degree to which the surface of the substrate is roughed due to etching is reduced. Furthermore, metal is prevented from adhering to the substrate, and the mixing ratio of the cleaning liquid can be easily controlled.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method for cleaning a surface of a semiconductor substrate, comprising:

a first cleaning step of supplying ozone water to a cleaning chamber through an ozone water supply line with an injection device such that the ozone water is applied to a surface of a semiconductor substrate set in the cleaning chamber;

a step of forming an oxide film on the surface of the semiconductor substrate by soaking the semiconductor substrate in the ozone water for a predetermined time period; and a second cleaning step, after the oxide firm is formed, of supplying ozone water through the ozone water supply line and injecting into the injection device an alkali liquid to mix the ozone water with the alkali liquid in a predetermined ratio, thereby generating a cleaning liquid, and supplying the cleaning liquid to the cleaning chamber such that the cleaning liquid is applied to the surface of the substrate, thereby to clean the surface thereof, wherein the etching of the surface of the semiconductor substrate by the cleaning liquid is weakened by the oxide film.

2. A method for cleaning a surface of a semiconductor substrate, comprising:

a first cleaning step of supplying ozone water to a cleaning chamber through an ozone water supply line with an injection device such that the ozone water is applied to a surface of a semiconductor substrate set in the cleaning chamber;

a step of forming an oxide film on the surface of the semiconductor substrate by soaking the semiconductor substrate in the ozone water for a predetermined time period;

a second cleaning step after the oxide film is formed, of supplying ozone water through the ozone water supply line and injecting into the injection device an ammonium hydroxide to mix the ozone water with the ammonium hydroxide in a predetermined ratio, thereby generating a cleaning liquid, and supplying the cleaning liquid to the cleaning chamber such that the cleaning liquid is applied to the surface of the substrate to clean the surface thereof, wherein the etching of the surface of the semiconductor substrate by the cleaning liquid is weakened by the oxide film; and a rinsing step of supplying pure water to the cleaning chamber to rinse the substrate, after the cleaning liquid is supplied to the cleaning chamber for a predetermined time period or a predetermined amount of the cleaning liquid is supplied thereto.

3. A method for cleaning a surface of a semiconductor substrate, comprising:

a first cleaning step of applying ozone water to a surface of a semiconductor substrate through an ozone water supply line with an injection device when the substrate is being rotated;

a step of forming an oxide film on the surface of the substrate by soaking the substrate in the ozone water for a predetermined time period, a second cleaning step of generating, after the oxide film is formed, a cleaning liquid in which ozone water is supplied through the ozone water supply line and ammonium hydroxide is injected into the injection device to mix the ozone water with the ammonium hydroxide in a predetermined ratio, and applying the cleaning liquid to the surface of the substrate to clean the surface thereof, wherein the etching of the surface of the semiconductor substrate by the cleaning liquid is weakened by the oxide film; and a rinsing step of applying, after the cleaning liquid is applied to the surface of the substrate for a predetermined time period or a predetermined amount of the cleaning liquid is applied thereto, pure water to the surface of the substrate to rinse the surface thereof, when the substrate is being rotated.

4. The method according to claim 3, wherein a plurality of semiconductor substrates are arranged apart from each other in positions within the cleaning chamber where the ozone water and the cleaning liquid are allowed to be applied to surfaces of said semiconductor substrates.

5. The method according to claim 2, further comprises:

a third cleaning step of supplying, after the rinsing step, ozone water to the cleaning chamber through an ozone water supply line with an injection device such that the ozone water is applied to the surface of the substrate;

a fourth cleaning step of generating, after the oxide film is formed, a second cleaning liquid in which ozone water is supplied through the ozone water supply line and one of hydrogen fluoride and hydrochloric acid is injected into the injection device to mix the ozone water with said one of hydrogen fluoride and hydrochloric acid, and supplying the second cleaning liquid to the cleaning chamber such that the second cleaning liquid is applied to the surface of the substrate, thereby to clean the surface thereof; and a second rinsing step of supplying pure water to the cleaning chamber such that the pure water is applied to the surface of the substrate to rinse the surface thereof, after the second cleaning liquid is supplied to the cleaning chamber for a predetermined time period or a predetermined amount of the second cleaning liquid is supplied thereto.

6. The method according to claim 2, wherein in the second cleaning step, the cleaning liquid is generated such that a volume ratio of the ozone-water to the ammonium hydroxide is 100:1.

7. The method according to claim 1 wherein in the second cleaning step, a ultrasonic wave having a high frequency of 1 MHz is radiated onto the substrate in the-cleaning chamber, when the substrate is cleaned by the cleaning liquid.

8. The method according to claim 2, wherein in the second cleaning step, a ultrasonic wave having a high frequency of 1 MHz is radiated to the cleaning liquid which is applied to the substrate in the cleaning chamber.

* * * * *